United States Patent [19]

Shirouzu et al.

[11] Patent Number: 4,631,811
[45] Date of Patent: Dec. 30, 1986

[54] LOCKING DEVICE FOR ELECTRONIC PARTS

[75] Inventors: Tatsuo Shirouzu; Nobuhiro Sakata; Masaki Kono; Saburo Inagaki, all of Miyagi, Japan

[73] Assignee: Alps Electric Co., Ltd., Japan

[21] Appl. No.: 775,595

[22] Filed: Sep. 13, 1985

[30] Foreign Application Priority Data

Sep. 14, 1984 [JP] Japan ............................. 59-140227[U]

[51] Int. Cl.⁴ .............................................. H05K 3/30
[52] U.S. Cl. ......................................... 29/705; 29/741
[58] Field of Search ................. 29/740, 741, 739, 840, 29/705, 714–719

[56] References Cited

U.S. PATENT DOCUMENTS 4,464,829  8/1984  Whitley et al. ..................... 29/741
4,557,043  12/1985  Starsky ............................... 29/741

Primary Examiner—Carl E. Hall
Attorney, Agent, or Firm—Guy W. Shoup

[57] ABSTRACT

A locking device for electronic parts each having two or more lead wires, including clinch pawls which can move a little when they abut on the lead wires. The small movement of these clinch pawls is detected by a detection mechanism and utilized to confirm if a given electronic part has been mounted on a print-circuit board.

4 Claims, 27 Drawing Figures

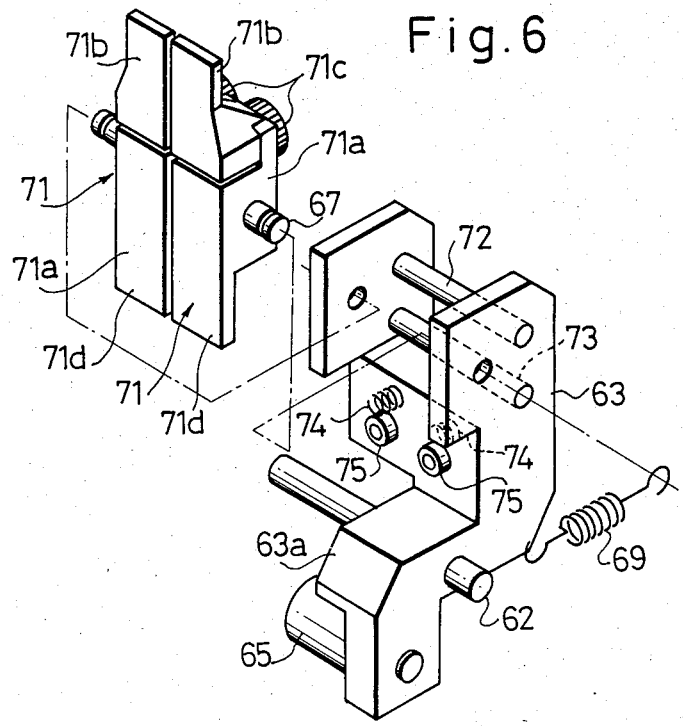
Fig. 6
Fig. 7(A)   Fig. 7(C)   Fig. 7(E)   Fig. 7(G)
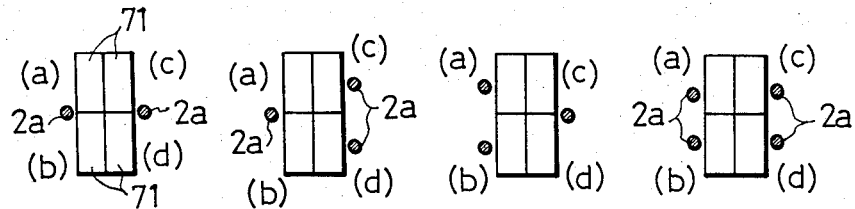
Fig. 7(B)   Fig. 7(D)   Fig. 7(F)   Fig. 7(H)
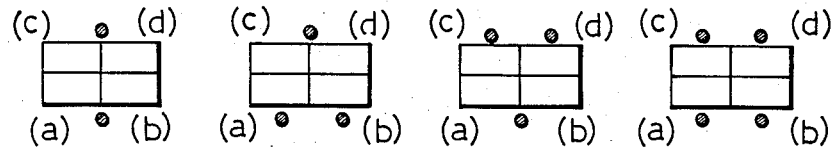

Fig. 9
Fig. 10
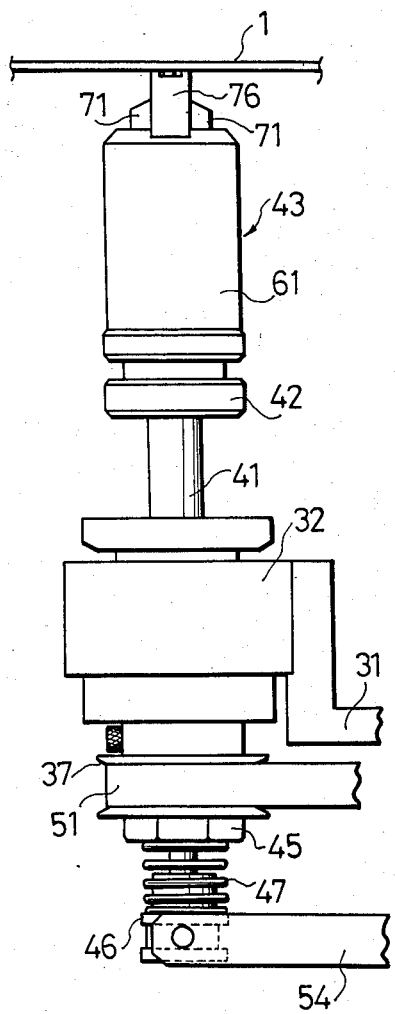
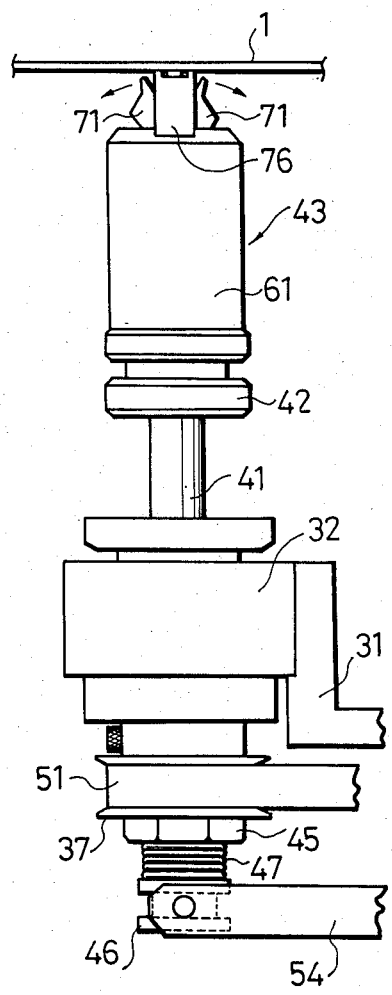

LOCKING DEVICE FOR ELECTRONIC PARTS

FIELD OF THE INVENTION

This invention relates to a locking device for electronic parts which, in mounting the electronic parts on a board or substrate, bends lead wires of the electronic parts toward the board to lock the electronic parts on the board.

BACKGROUND OF THE INVENTION

Recently, the work of locking the electronic parts on a print-circuit board of an electronic equipment has been carried out by the use of an automatized machine.

The conventional automatized machine supplies, as shown in FIGS. 13 and 14, electronic parts 2, such as ICs, resistors, or condensers, linked on a tape onto a print-circuit board 1 and inserts lead wires 2a into attachment holes 1a of the print-circuit board 1. Then, the ends of the lead wires 2a are bent by a clinch head 3 on the opposite side of the print-circuit board 1.

Generally, the number of lead wires 2a of the electronic parts 2 to be mounted on the print-circuit board varies from two, three, to four or so, depending upon the type of parts. In order to meet the difference in number of lead wires 2a, in the prior art, the clinch head 3 was interchanged according to the type of the electronic parts 2 to be mounted. Thus, the working efficiency was low and poor.

Further, in case the electronic parts 2 have three lead wires 2a each, its orientation of mounting may take any one of four poses or patterns as shown in FIGS. 15(A)-15(D). Accordingly, the clinch head 3 must be turned up to 360 degrees correspondingly to the respective orientations shown in FIGS. 15(A)-15(D), and this makes a rotary mechanism of the clinch head 3 into a more complicated one.

Furthermore, though it might be possible to improve the working efficiency by equipping the clinch head 3 with a mechanism of detecting whether or not a given electronic part 2 is mounted correctly on the print-circuit board 1, in order to detect the number of lead wires 2a of this electronic part 2 and to discriminate if it is the given one, a complicated mechanism must be incorporated in the clinch head 3, thereby resulting in the drawback that the clinch head 3 becomes a large-sized one. In addition, in case the electronic parts 2 have three lead wires 2a each as shown in FIG. 15, a detection mechanism as well as the clinch head 3 had to be turned up to 360 degrees in response to the orientation of the lead wires 2a.

SUMMARY OF THE INVENTION

The present invention has been devised in view of the drawbacks of the prior art, and its object is to provide a locking device for electronic parts which can surely detect whether or not lead wires of a given electronic part have been clinched and perform clinching and detecting operation on the lead wires irrespective of the types of electronic parts with variations in number of lead wires.

In brief, a locking device for electronic parts according to the present invention comprises a clinch head positioned opposing an electronic partsmounting board from which the lead wires of the parts are projecting, an advance/retreat mechanism for advancing and retracting the clinch head relative to the board, a rotary mechanism for turning the clinch head, the clinch head having a pair of drive arms whose tips are driven in the opening or closing direction and clinch pawls pivoted on the drive arms, the clinch pawls being forced by springs in the direction of further opening or closing relative to the drive arms, and a detection mechanism for detecting the operation of each of the clinch pawls having moved a little in the direction opposing to the force of a spring as the result of each clinch pawl having abutted on the lead wire of the electonic parts.

As the drive arms are driven to open or close and the clinch pawls abut on the lead wires of the electronic parts, the clinch pawls move a little in opposition to the force of the spring, this movement is detected by the detection mechanism, and through this detection a determination is made as to whether the given electronic parts have been clinched or not.

BRIEF DESCRIPTION OF THE DRAWINGS

FIGS. 1 through 12 relate to an embodiment according to the present invention in which;

FIG. 1 is a plane view of a clinch head;

FIG. 2 is a front view of the clinch head;

FIG. 3 is a side view of the clinch head;

FIG. 4 is a schematic diagram showing the mechanism of the clinch head;

FIG. 6 is an exploded perspective view showing an important portion of the clinch head;

FIGS. 7(A) through 7(H) are explanatory views showing clinching operation and detecting operation on lead wires;

FIG. 8 is a sectional view showing the whole clinching mechanism;

FIGS. 9 and 10 are explanatory views of advance/retreat operation of the clinch head;

FIG. 11 is front view showing wholly the locking device for electronic parts; and FIG. 12 is a plane view of the locking device;

DETAILED DESCRIPTION OF THE PREFERRED EMBODIMENT

An embodiment of the present invention will be described with reference to FIGS. 1 through 12.

Figure 11:
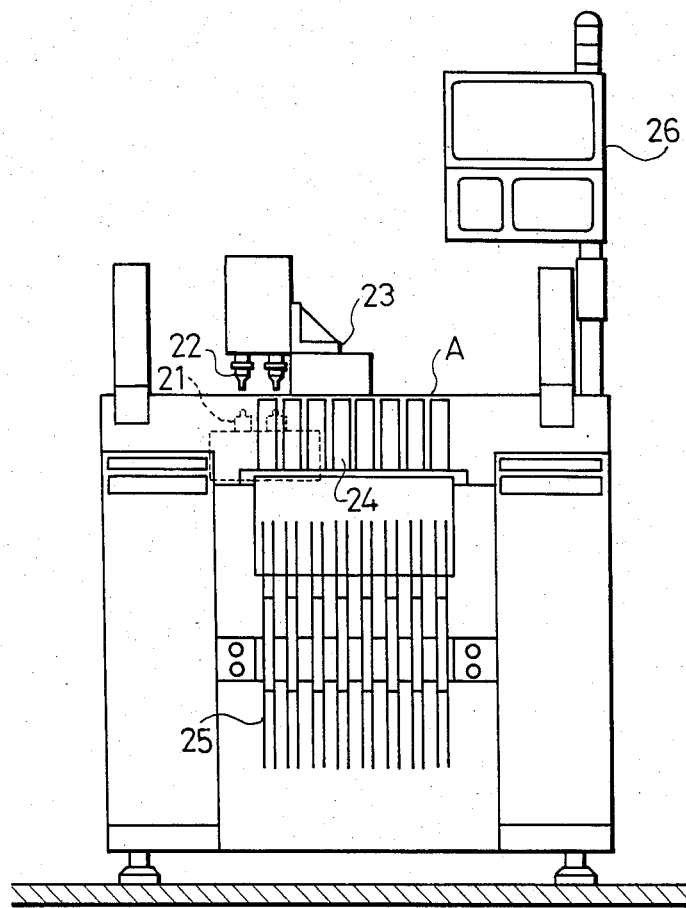
Figure 12:
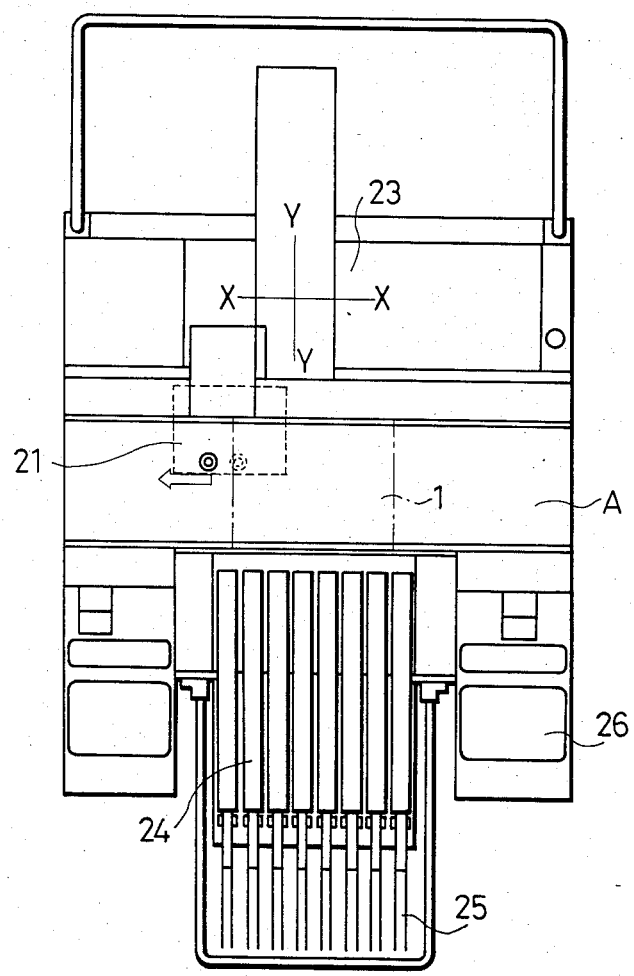
Figure 13:
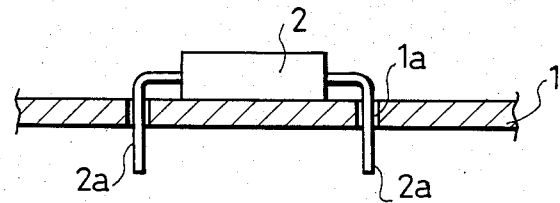
FIGS. 13 and 14 are explanatory views of clinching operation effected by the conventional locking device for electronic parts.
Figure 14:
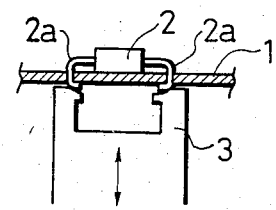
Figure 15A:
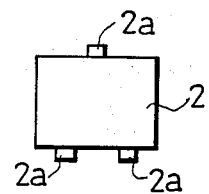
FIGS. 15(A) through 15(D) are explanatory views illustrating the problems of the prior art.
Figure 15B:
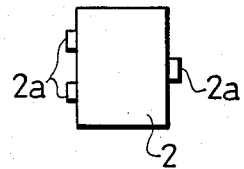
Figure 15C:
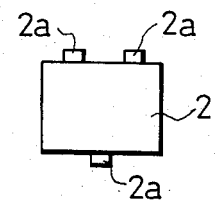
Figure 15D:
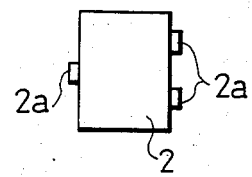

In FIGS. 11 and 12 showing wholly the locking device for electronic parts, the symbol A represents a feed path of a print-circuit board 1. The print-circuit board 1 is supplied from the right-hand side in the drawing and conveyed to the left-hand side. On the way of the feed path A, there are two clinch mechanisms 21 on the underside of the print-circuit board 1 and head chucks 22 above the print-circuit board 1, both opposing to the board. The clinch mechanism 21 and the head chuck 22 are opposing mutually on one line, and supported by a driving mechanism 23 so that they can be driven in the X-Y directions opposite a desired location on the print-circuit board 1. By the side of the feed path A of the print-circuit board 1 there are provided a parts-supply mechanism 24 and, below the former, a set of reels 25. On each reel of the reel set 25 a tape is rolled which has electronic parts of one type linked thereby, this tape being extended up to the parts-supply mechanism 24.

The head chuck 22 is designed so that it can cross the feed path A and advance up to the position of the parts-supply mechanism 24 when moved in the Y direction. The head chuck 22, having moved to that position, holds an electronic part and separates the same from the tape.

The electronic part held by the head chuck 22 is supplied to a given location on the print-circuit board 1, where the lead wires of the electronic part are inserted into attachment holes in the print-circuit board 1. Then, the lead wires are bent by the clinch mechanism 21, whereby the electronic part is secured on the print-circuit board 1.

Now, the structure of the clinch mechanism 21 will be described.

Figure 8:
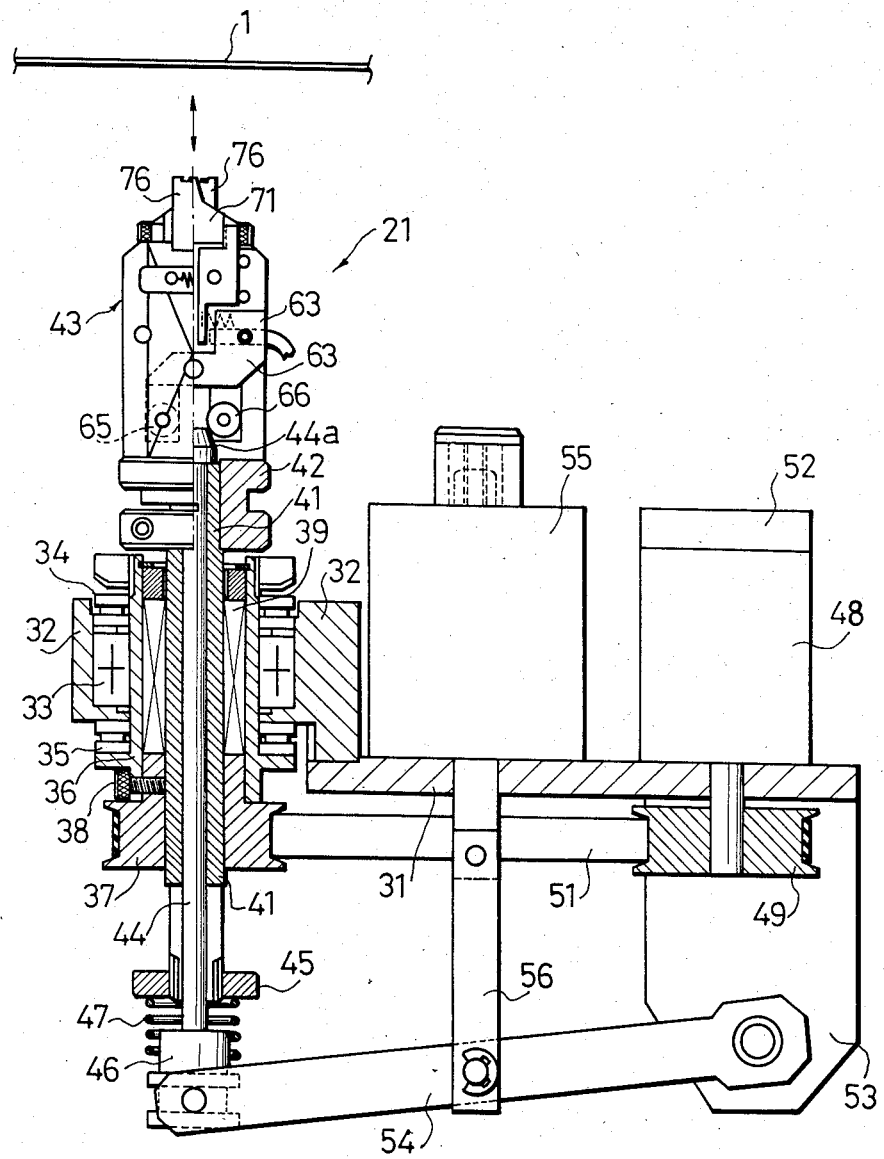

As shown in FIG. 8, the clinch mechanism 21 is supported by a holder 32 integral with a base 31. The holder 32 has a bearing 33 and thrust bearings 34 and 35 positioned on the upper and lower sides of the former, by these bearings 33, 34 and 35 an outer sleeve 36 is supported rotatably. At the lower end of the outer sleeve 36 a toothed pulley 37 is fixed by a bolt 38. Inside the outer sleeve 36 a linear bearing 39 is held, and by this linear bearing 39 an inner sleeve 41 is held. This inner sleeve 41 is slidable through the linear bearing 39 and the pulley 37 vertically in the drawing. The inner sleeve 41 and the pulley 37 are spline-engaged so that both can rotate in unison. To the upper end in the drawing of the inner sleeve 41 a clinch head 43 is attached via a coupling member 42. To the lower end of the inner sleeve 41 a nut 45 is secured, so that the limit of elevation stroke of the inner sleeve 41 is defined by abutment of the nut 45 on the lower end of the pulley 37. Through the inner sleeve 41 a main spindle 44 is inserted. The main spindle 44 is provided at its lower portion with a coupling head 46 integrally therewith, and a coil spring 47 is interposed between the coupling head 46 and the nut 45.

As shown in FIG. 8, on the base 31 a torque actuator 48 is mounted to provide a driving force of rotation, and a toothed pulley 49 secured on the shaft of the actuator is coupled to the toothed pulley 37 via a toothed belt 51. On the upper portion of the torque actuator 48 a rotation stopper 52 is equipped, which is set so that the turning angle of the toothed pulley 49 is 90 degrees. That is, as the toothed pulley 49 is driven to rotate 90 degrees by the torque actuator 48, the pulley 37 is also turned 90 degrees by means of the toothed belt 51. Further, the outer sleeve 36 secured integrally to the toothed pulley 37 is also driven to rotate. In addition, the inner sleeve 41 spline-engaged with the toothed pulley 37 rotates together, and the clinch head 43 provided on the upper portion also turns 90 degrees in unison.

On the lower face of the base 31 a bracket 53 is provided (shown only in FIG. 8), and a lever 54 supported rotatably by the bracket 53 is coupled at its point to the coupling head 46. On the base 31 there is provided a cylinder 55 for advance/retreat driving, the plunger of which is coupled to a midway of the lever 54 via a coupling arm 56. As the lever 54 is raised by the cylinder 55, the coupling head 46 coupled to the point of that lever moves up, its rising force is transmitted to the nut 45 via the coil spring 47, the inner sleeve 41 integral with the nut 45 moves up, thus, the clinch head 43 moves up together. After the nut 45 has abutted on the pulley 37, the coil spring 47 contracts and only the main spindle 44 moves up.

Now, the structure of the clinch head 43 which is the principal portion of the present invention will be described with reference to FIGS. 1 through 6.

Figure 4:
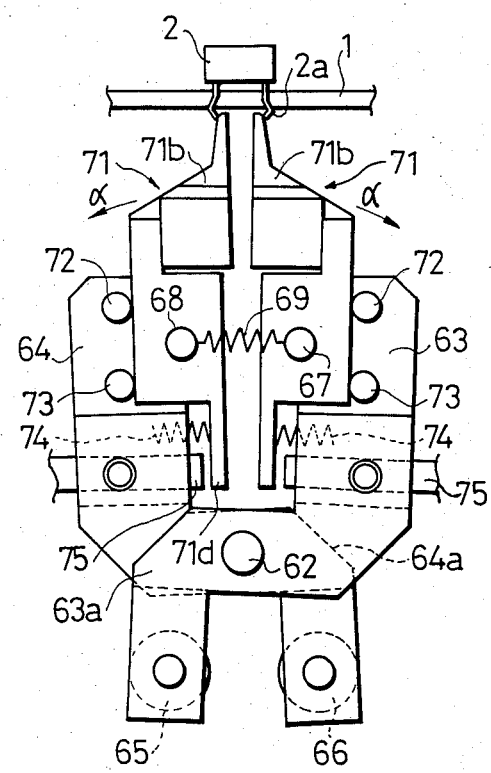

A head holder 41 of the clinch head 45 is secured to the upper end of the inner sleeve 41 via the coupling member 42. In the center of the head holder 61 a supporting shaft 62 passes therethrough, by which drive arms 63 and 64 are supported. One drive arm 63 has the configuration shown in FIG. 6 in perspective view. The other drive arm 64 has the same shape as that of the drive arm 63, and both drive arms 63 and 64 are assembled as to face each other as shown in FIG. 4. The lower portion each of the drive arms 63 and 64 is narrowed to form a support section 63a or 64a, and these support sections 63a and 64a are supported rotatably by the supporting shaft 62. At the lower end of the drive arm 63 a roller 65 is received by a shaft, and a roller 66 is received by a shaft at the lower end of the drive arm 64. The two rollers 65 and 66 are opposing one to another with a given distance therebetween, and, below these rollers 65 and 66, a tapered section 44a which is the head section of the main spindle 44 is opposing to these rollers (see FIG. 2). As the main spindle 44 is driven to move up by the cylinder 55 shown in FIG. 8, the tapered section 44a at the upper end of the main spindle 44 pushes both rollers 65 and 66 laterally, so that a pair of drive arms 63 and 64 achieve the open action. At the upper center of the drive arm 63 a shaft 67 is provided, and a shaft 68 is provided at the upper center of the other drive arm 64. Between the shafts 67 and 68 a spring 69 is interposed, so that by the force of this spring 69 both drive arms 63 and 64 are forced in the direction of mutually approaching or closing.

As shown in FIG. 6, the upper section of the drive arm 63 is hollow, inside this hollow section there being provided two clinch pawls 71 side by side. Each clinch pawl 71 consists of a lower piece 71a and an upper piece 71b, both pieces being secured together by a bolt 71c. The lower piece 71a is supported by the shaft 67. The drive arm 63 has a pair of stopper shafts 72 and 73 bridged thereon, these stopper shafts 72 and 73 being positioned behind both clinch pawls 71 opposing thereto with a slight gap. Within the extent of this slight gap the clinch pawls 71 can pivot a slight angle about the shaft 67. Similarly, the other drive arm 64 has a pair of clinch pawls 71 supported by a shaft 68. These clinch pawls 71 on the side of the drive arm 64 are also restricted by stopper shafts 72 and 73, but can pivot a slight angle. As shown in FIG. 4, the clinch pawls 71 on the drive arm 63 side and the clinch pawls 71 on the drive arm 64 side are facing each other, and the upper pieces 71b are opposing one to another.

Further, as shown in FIGS. 4 and 6, in the center section each of the drive arms 63 and 64 there is provided a coil spring 74. Four coil springs 74 are equipped in all, each pressing a lower plate section 71d of the lower piece 71a of the corresponding clinch pawl 71. By this spring force the respective clinch pawls 71 are opened in the a direction within the extent defined by the stopper shafts 72 and 73. On the under side of each coil spring 74 a magnetic sensor 75 is provided. The magnetic sensor 75 is opposed to the lower plate section 71d of the corresponding clinch pawl 71, and can detect if the clinch pawl 71 has been pushed by the coil spring 74 and is in the open position or if the same has moved a little in opposition to the force of the coil spring 74 and is in the closed position.

Figure 1:
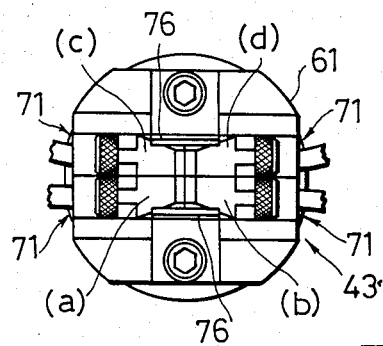
Figures 2, 3:
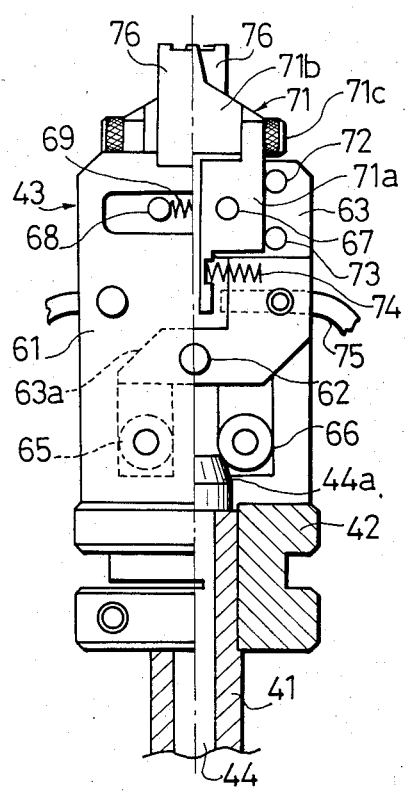

As shown in FIGS. 1 through 3, both sides of the points of the clinch pawls 71 are covered by cover plates 76.

Now, the operation of the locking device for electronic parts of the foregoing structure will be described.

The print-circuit board 1 is supplied from the right-hand side in FIGS. 11 and 12 along the feed path A of the device. The electronic parts to be supplied onto the print-circuit board 1 are linked on the tape. Each reel of the reel set 25 has the parts of one type rolled therearound. The tape rolled on the reel is extended up to the partssupply mechanism 24, where the head chuck 22 separates the electronic part from the tape. The electronic part separated and held by the head chuck 22 is conveyed onto the print-circuit board 1, where its lead wires 2a are inserted into the installation holes.

Then, the cylinder 55 (see FIG. 8) on the base 31 is energized to raise the lever 54. As the lever 54 is raised, the coupling head 46 coupled to the point of the lever is driven to move up, this rising force is transmitted to the nut 45 via the coil spring 47, and the inner sleeve 41 is driven to slide through the linear bearing 39 and the toothed pulley 37 and to move up. Thus, the clinch head 43 secured to the point of the inner sleeve 42 also moves up. Then, as shown in FIG. 9, while the nut 45 is abutting on the lower end of the pulley 37, the cover plate 76 positioned at the point of the clinch head 43 abuts on the underside (the side from which the lead wires 2a of the electronic part 2 is projecting) of the print-circuit board 1.

As the lever 54 is raised further by the cylinder 55, thereafter the inner sleeve 41 and the clinch head 43 do not move up, the coil spring 47 contracts, and only the main spindle 44 moves up. Then, the tapered section 44a at the upper end of the main spindle 44 pushes the two rollers 65 and 66 laterally. As a result, a pair of drive arms 63 and 64 pivot about the supporting point or the shaft 62 to open in the α directions (see FIG. 4) in opposition to the force of the spring 69. Thus, the tips of the upper pieces 71b of the clinch pawls 71, every two of which are supported by either drive arm 63 or 64, abut on the lead wires 2a of the electronic part 2 from their inside (the state shown in FIG. 5(A)), and, in response to advancing of the open action of the drive arms 63 and 64, the lead wires 2a are bent outward, thereby the electronic part 2 is secured (the state shown in FIG. 5(B)).

In case the electronic part 2 to be mounted on the print-circuit board 1 has turned 90 degrees, before the clinching operation the torque actuator 48 shown in FIG. 8 is started to turn 90 degrees the toothed pulley 37 by means of the toothed belt 51. In response thereto, the outer sleeve 36 secured to the pulley 37 and the inner sleeve 41 spline-engaged with the pulley 37 are turned too, thus, the orientation of the clinch head 43 is changed 90 degrees. In this changed position the clinching operation is effected on the lead wires 2a of the electronic part 2.

At the time the lead wires 2a are bent by the clinch pawls 71, the detecting operation is performed as below.

Figure 5A:
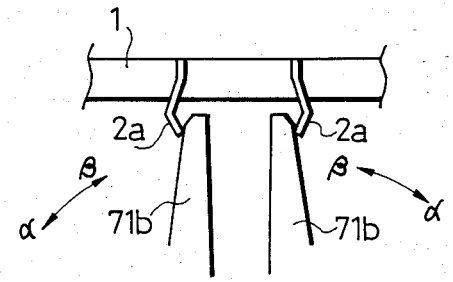
FIGS. 5(A) through 5(C) are explanatory views of operation of the clinch head.
Figure 5B:
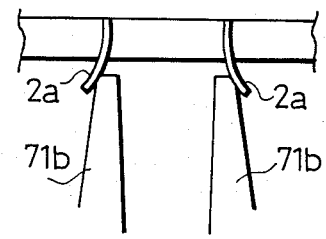
Figure 5C:
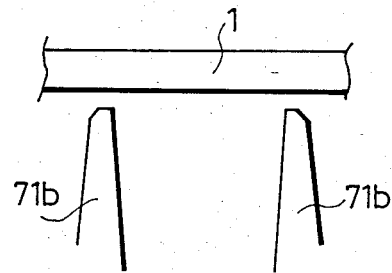

As described hereinabove, the clinch pawl 71 can pivot a slight angle about the shaft 67 or 68 within the allowed extent defined by the stopper shafts 72 and 73, and, within the extent of this pivoting operation, is forced in the α direction shown in FIG. 4 (the open direction) by the pushing force of the coil spring 74. As the drive arms 63 and 64 are driven to open as the result of the foregoing operation and the tip of the upper piece 71b of the clinch pawl 71 abuts on the lead wire 2a as shown in FIG. 5(A), its reaction force acts on the clinch pawl 71. In response to this reaction force, the clinch pawl 71 pivots a little in the closing direction (the α direction shown in FIG. 5(A)) about the shaft 67 or 68 in opposition to the force of the coil spring 74 within the extent allowed by the stopper shafts 72 and 73. This action is detected by the magnetic sensor 75, and by the presence of this detected output it is possible to recognize the state that the clinch pawl 71 is bending the lead wire 2a. On the contrary, if, as shown in FIG. 5(C), the clinch pawl 71 does not abut on the lead wire 2a and is engaged in lost motion, the clinch pawl 71 is brought simply by the coil spring 74 to the open direction (the α direction) and the detected output from the magnetic sensor 75 does not change, whereby the lost motion can be recognized.

This detection operation is performed individually on each of the four clinch pawls 71. Thus, by judging which ones of the four clinch pawls 71 are abutting on the lead wires 2a the number of lead wires 2a can be recognized, whereby it is possible to confirm as to whether a given electronic part corresponding to a pre-programmed type has surely been mounted or not. This recognition operation relative to the type of electronic parts will be described in greater detail hereinafter with reference to FIG. 7.

There are four clinch pawls 71 in the embodiment which are represented by symbols (a)–(d) (see FIG. 1).

In the case of the electronic parts each having two lead wires 2a, the dispostion of these lead wires 2a produces two patterns as shown in FIGS. 7(A) and 7(B). For the pattern of FIG. 7(A), pawl (a) or (b) or both pawls (a,b) out of four clinch pawls 71 abut on the lead wire 2a and this abutment is detected by the magnetic sensor(s) 75. At the same time, the magnetic sensor(s) 75 corresponding to pawl (c) or (d) or both produces the detection signal. Consequently, it can be recognized that the electronic part having two lead wires 2a has been mounted. For the pattern of FIG. 7(B), the clinching operation is carried out after the clinch head 43 has been turned 90 degrees. In this case, similarly to the above, the two lead wires 2a can be recognized from detecting the state that either/both of pawls (a) and (b) and either/both of pawls (c) and (d) are abutting on the lead wires.

In the case of the electronic parts each having three lead wires 2a, the dispostion of these lead wires 2a produces four patterns as shown in FIGS. 7(C), 7(D), 7(E) and 7(F). The pattern of FIG. 7(C) can be recognized from detecting the state that either/both of pawls (a) and (b) out of four clinch pawls 71 are abutting on the lead wire 2a and both pawls (c) and (d) are abutting on corresponding lead wires 2a. For the pattern of FIG. 7(E), the orientation of the clinch head 43 is the same as for the pattern of FIG. 7(C), and this pattern can be recognized from detecting the state that both pawls (a) and (b) out of four clinch pawls 71 are abutting on corresponding lead wires 2a and either/both of pawls (c) and (d) are abutting on the lead wire 2a. For the pattern of FIG. 7(D), the clinching operation is carried out after the clinch head 43 has been turned 90 degrees. In this case, the lead wires 2a can be recognized from detecting the state that both pawls (a) and (b) and either/both of pawls (c) and (d) out of four clinch pawls 71 are abutting on the lead wires 2a. In the case of the pattern of FIG. 7(E), similarly to the above, after the clinch head 43 has been turned 90 degrees (resulting in the position similar to the pattern of FIG. 7(D)), the lead wires can be recognized from detecting the state that either/both of pawls (a) and (b) and both pawls (c) and (d) are abutting on the lead wires 2a.

In the case of the electronic parts each having four lead wires 2a, the orientation of attachment produces two patterns shown in FIGS. 7(G) and (H). For the pattern of FIG. 7(H), the clinching operation is carried out after the clinch head 43 has been turned 90 degrees. In either case of patterns 7(G) and 7(H), the lead wires 2a can be recognized from detecting the state that all pawls (a) through (d) are abutting on the lead wires.

As apparent from the foregoing description, by the use of the clinch head 43 of the present embodiment and by turning 90 degrees the clinch head 43 as required, the exact clinching and detecting operation can be performed irrespective of wide variations in number and disposition of the lead wires 2a.

Although the embodiment performs bending of the lead wires 2a by the opening action of the drive arms 63, 64, it is also possible to bend inward the lead wires 2a by the closing action of the drive arms 63, 64, contrarily to the embodiment. In the latter case, the same effect as that of the foregoing embodiment can be obtained by forcing the clinch pawls 71 in the closing direction by means of the springs 74, and by detecting by means of the detection mechanisms 75 the state that the clinch pawls 71 having abutted on the lead wires 2a are going to open because of the reaction force of abuttment.

As apparent from the foregoing description, according to the present invention, the clinch head has the drive arms, each drive arm has the clinch pawls pivotable a slight angle, and the detection is performed as to whether the clinch pawl is abutting on the lead wire or not. Accordingly, it becomes possible by employment of a simple mechanism to confirm whether or not the lead wires of the electronic parts have been bent, and mis-mounting of the electronic parts can be eliminated.

Further, by providing each drive arm with two clinch pawls, the number and orientation of disposition of the lead wires of the electronic parts of different types can surely be confirmed, as described with reference to FIG. 7. Furthermore, only through the step of turning 90 degrees the clinch head, the clinching and detecting operation becomes effective for various types of electronic parts and variations in number of lead wires.

What is claimed is:

1. A locking device for electronic parts comprising
   a clinch head positioned opposing to the face of an electronic parts-mounting board from which face the lead wires of the parts are projecting,
   an advance/retreat mechanism for advancing and retracting said clinch head relative to the board,
   a rotary mechanism for turning said clinch head,
   said clinch head having a pair of drive arms whose tips are driven in the opening or closing direction and clinch pawls pivoted on said drive arms,
   said clinch pawls being forced by springs in the direction of further opening or closing relative to said drive arms, and
   a detection mechanism for detecting the operation of each of said clinch pawls having moved a little in the direction opposing to the force of said spring as the result of each clinch pawl having abutted on the lead wire of the electronic parts.

2. A locking device for electronic parts as set forth in claim 1, wherein each of said drive arms has two clinch pawls.

3. A locking device for electronic parts as set forth in claim 1, wherein said detection mechanism includes magnetic sensors whose number corresponds to the number of said clinch pawls.

4. A locking device for electronic parts as set forth in claim 1, wherein said rotary mechanism turns said clinch head 90 degrees per each energization.

* * * * *